(12) United States Patent
Kuo et al.

(10) Patent No.: US 6,989,693 B2
(45) Date of Patent: Jan. 24, 2006

(54) PULSE INTERVAL TO VOLTAGE CONVERTER AND CONVERSION METHOD THEREOF

(75) Inventors: Terry B. J. Kuo, Ji-An (TW); Cheryl C. H. Yang, Ji-An (TW)

(73) Assignee: Leadtek Research Inc., Taipei Hsien (TW)

( * ) Notice: Subject to any disclaimer, the term of this patent is extended or adjusted under 35 U.S.C. 154(b) by 0 days.

(21) Appl. No.: 10/708,645

(22) Filed: Mar. 17, 2004

(65) Prior Publication Data

US 2004/0232965 A1    Nov. 25, 2004

(30) Foreign Application Priority Data

May 21, 2003    (TW) .............................. 92113765 A

(51) Int. Cl.
*H03D 3/00*    (2006.01)
(52) U.S. Cl. ...................................... 327/102; 327/160
(58) Field of Classification Search ................. 327/35, 327/102, 113, 115, 117, 141, 142, 160
See application file for complete search history.

(56) References Cited

U.S. PATENT DOCUMENTS

| | | | | |
|---|---|---|---|---|
| 4,168,679 A | * | 9/1979 | Ikeura et al. ................ 123/399 |
| 4,532,561 A | * | 7/1985 | Kimura et al. ............ 360/73.01 |
| 4,956,730 A | * | 9/1990 | Arai et al. ..................... 360/70 |
| 4,985,786 A | * | 1/1991 | Arai et al. ..................... 360/70 |
| 5,053,790 A | * | 10/1991 | Stephenson et al. ......... 347/192 |
| 5,218,486 A | * | 6/1993 | Wilkinson .................... 360/27 |
| 5,680,246 A | * | 10/1997 | Takahashi et al. ...... 359/341.43 |

* cited by examiner

*Primary Examiner*—Timothy P. Callahan
*Assistant Examiner*—Cassandra Cox
(74) *Attorney, Agent, or Firm*—Connolly Bove Lodge & Hutz LLP; Larry J. Hume

(57) ABSTRACT

A Pulse Interval to Voltage Converter (PIVC) and conversion method thereof is revealed. The PIVC comprises a clock generator, a counter, a latch, a digital-to-analog converter (DAC), a delay unit, a frequency regulator and an underflow protection unit. New components, such as the delay unit, the frequency regulator and the underflow protection unit, are incorporated into the present invention, unlike the conventional art. The delay unit is intended for the programming of the default duration of delay, so as to delay the time for the counter to reset to zero, and in consequence regulate the baseline of the output voltage. The frequency regulator can regulate the clock generation frequency of the clock generator, so as to regulate the resolution of the output voltage. The underflow protection unit turns back external signals while the delay unit is operating, so as to minimize interference from noise.

14 Claims, 15 Drawing Sheets

PULSE INTERVAL TO VOLTAGE CONVERTER AND CONVERSION METHOD THEREOF

BACKGROUND OF THE INVENTION

1. Field of the Invention

The present invention is related to a Pulse Interval to Voltage Converter (PIVC) and the conversion method thereof, more particularly, to a programmable PIVC and conversion method thereof.

2. Description of the Related Art

PIVCs are equipment commonly used in industry and biomedicine, which can express every pulse interval in the form of voltage. As shown in FIG. 1(a), $T_1$ and $T_6$ denote the intervals of each pulse 11, and after conversion, its voltage is directly proportional to the interval of each pulse 11. In other words, the greater an interval is, the greater the output voltage is. In addition, PIVCs are roughly divided into two types, namely analog and digital, depending on the design.

FIG. 1(b) illustrates the operation of a digital PIVC, that is, a counter 13 starts to run immediately after a pulse 11 is received, but on receipt of the next pulse 11, the counter 13 resets to zero and then runs again. Before resetting to zero, the counter 13 has to send the count to a latch 14. A digital-to-analog converter (DAC) 15 converts the count, which stands for a pulse interval, to a voltage signal.

Nevertheless, the aforesaid design has the following problems. First, low resolution of output voltage may occur. In the case of an output voltage displayed by 8 bits, a pulse interval is partitioned into a maximum of 256 levels, and the degree of the discrepancy between it and the next pulse interval is usually less than 10%. In other words, only about 26 levels out of 256 are useful in distinguishing a pulse interval from the next one. Hence, it does not make good use of the bits available, resulting in the low-resolution display of voltage. In view of this, resolution will not be increased, unless the counter, the latch and the digital-to-analog converter employ more bits. However, adding more bits will greatly increase the cost. Secondly, the PIVC may be susceptible to interference. Noise which appears in between two normal pulses may be deemed a pulse; in such circumstances the counter 13 resets to zero early, decreasing the count received by the latch 14 considerably. Referring to FIG. 1(c), if noise 16 occurs between two normal pulses 11, the count from the counter 13 sends to the latch 14 will greatly decrease, and thus the output voltage of a normal pulse 11 will be several times greater than the output voltage of the noise 16.

Since the conventional method has the aforementioned problems of low resolution and being susceptible to interference, it is necessary to improve the design.

BRIEF SUMMARY OF THE INVENTION

The objective of the present invention is to provide a programmable PIVC and conversion method thereof, through which a delay is set in advance, the count of the clock between two pulses is calculated and the resolution of the output voltage is regulated, with a view to performing regulation to meet various needs. In addition, the PIVC and conversion method thereof of the present invention ignore pulse signals during a delay so as to avoid the influence of short-period noise.

The PIVC of the present invention comprises a clock generator, a counter, a latch, a digital-to-analog converter and a delay unit. The clock generator generates a clock signal to be sent to the counter and the delay unit. The counter calculates a count equivalent to the number of clock cycles between two pulses in the presence of the clock signal. Besides, the counter receives a zero-reset signal generated by the delay unit and resets to zero. The latch receives and locks the count calculated instantaneously by the counter. The digital-to-analog converter converts the count locked by the latch to an analog signal of voltage. The delay unit delays the calculation of the number of clock cycles between the two pulses by the counter so as to regulate the baseline of output voltage.

The pulse interval to voltage conversion method of the present invention comprises Steps (a)–(d). Step (a) is designed to delay an input pulse signal. Step (b) is involved with the calculation of the period between the input pulse signal and the preceding input pulse signal. Step (c) involves converting the period to a digital voltage. Step (d) is intended to convert the digital voltage to an analog voltage.

Additionally, the PIVC may further comprise a frequency regulator and an underflow protection unit. The frequency regulator can either be a frequency divider or a frequency multiplier for regulating the resolution of the output voltage. The underflow protection unit turns back external signals while the delay unit is operating, so as to minimize interference from noise.

DETAILED DESCRIPTION OF THE INVENTION

Figure 1A:
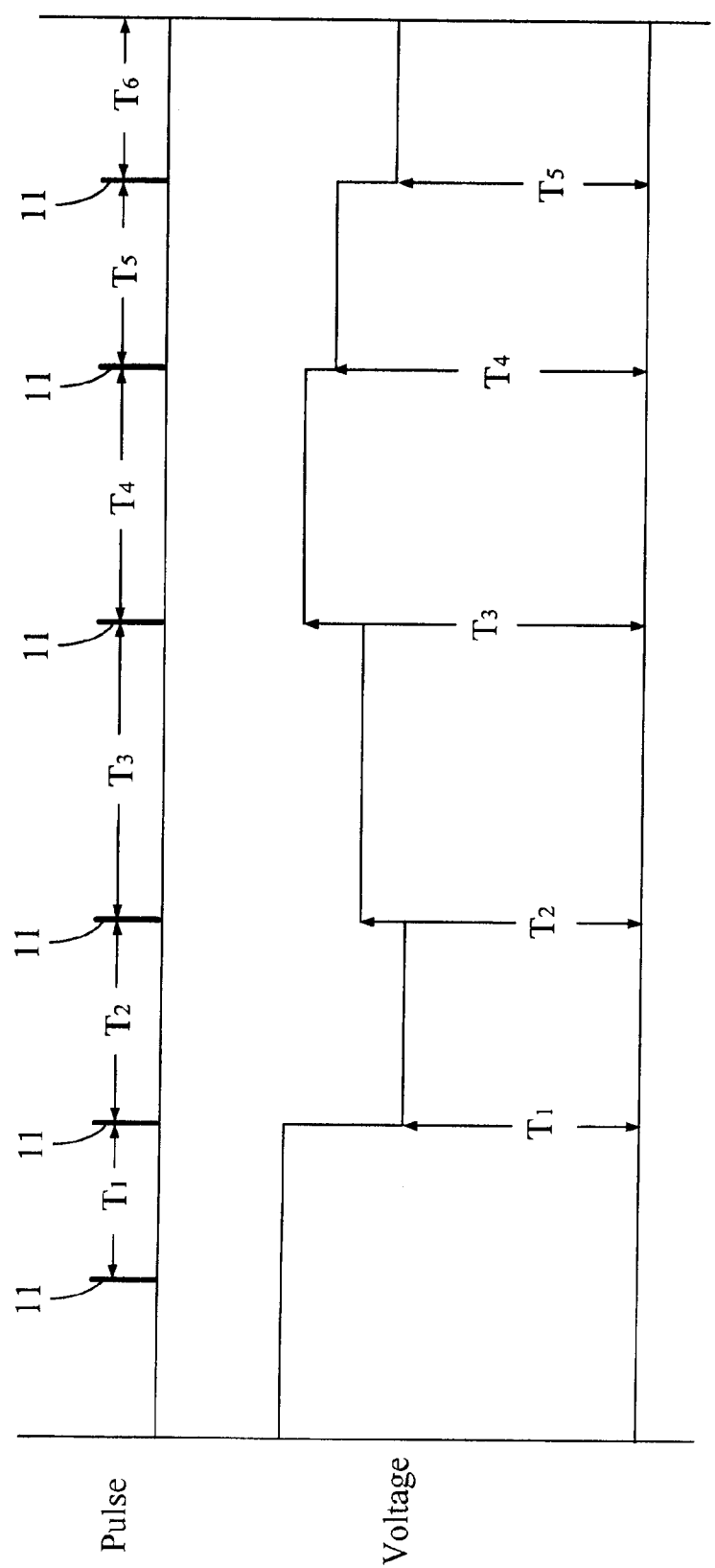
FIG. 1(a) illustrates the conversion of a known PIVC.
Figure 1B:
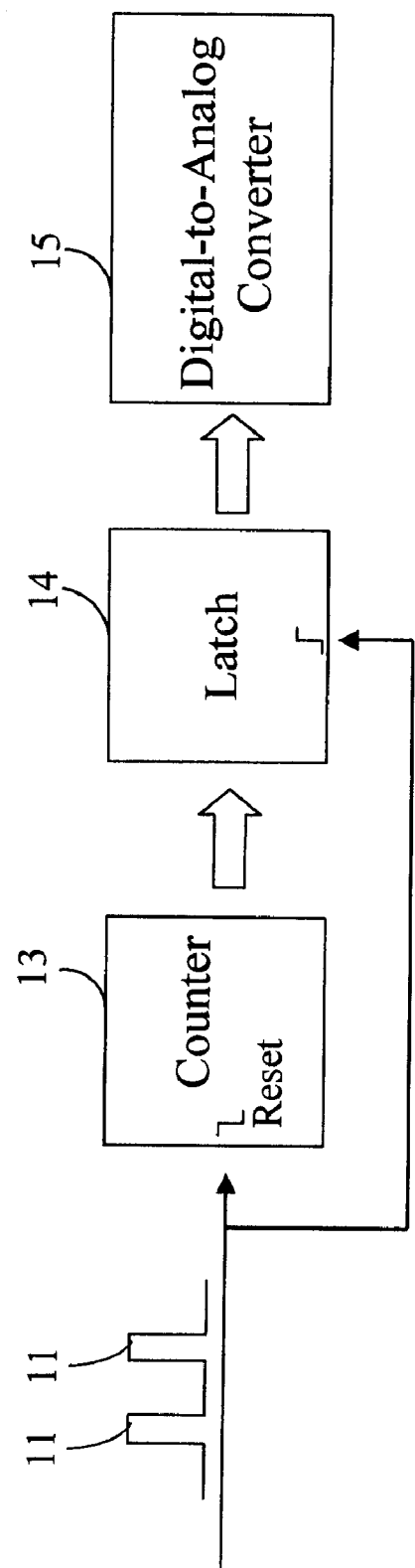
FIG. 1(b) illustrates a function diagram of a known PIVC.
Figure 1C:
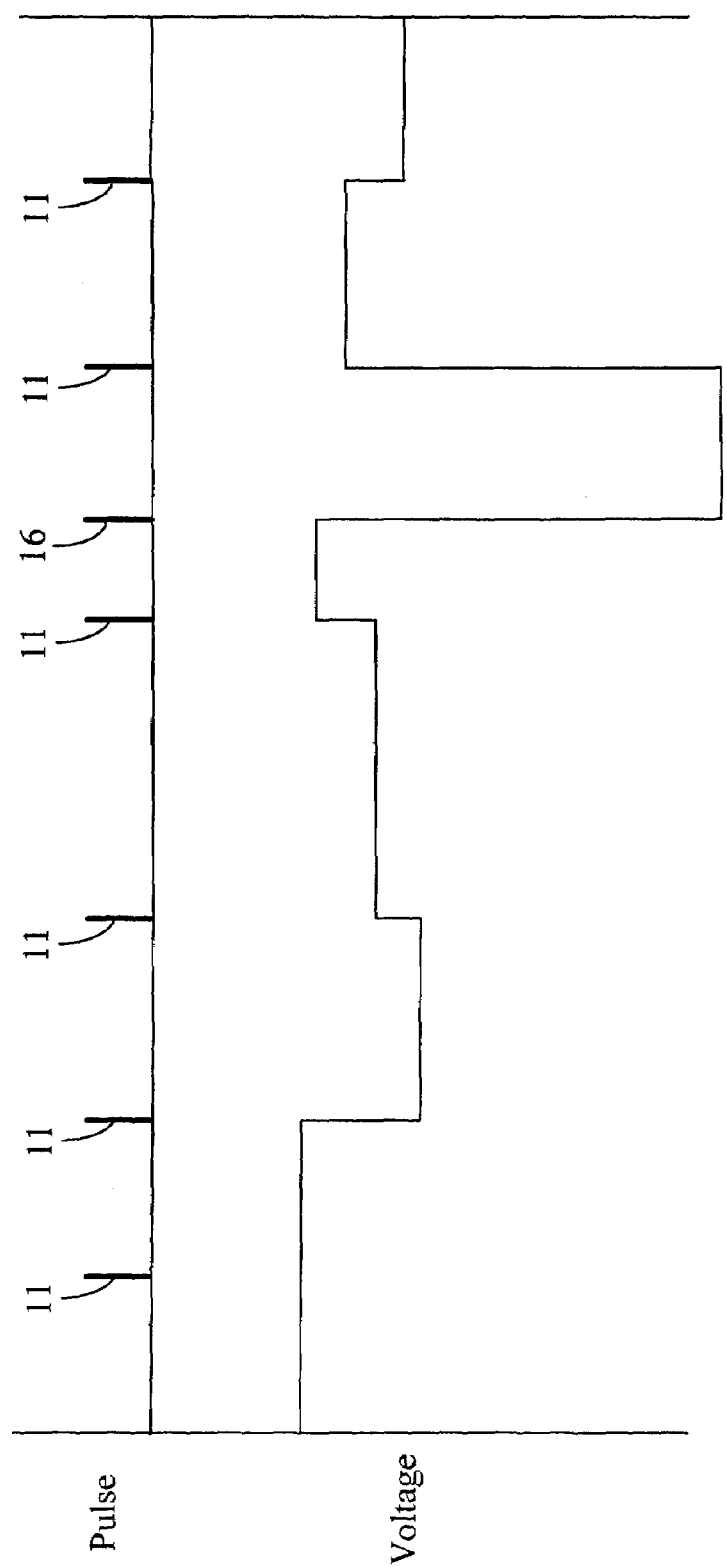
FIG. 1(c) illustrates the effect of a noise to a known PIVC.
Figure 2A:
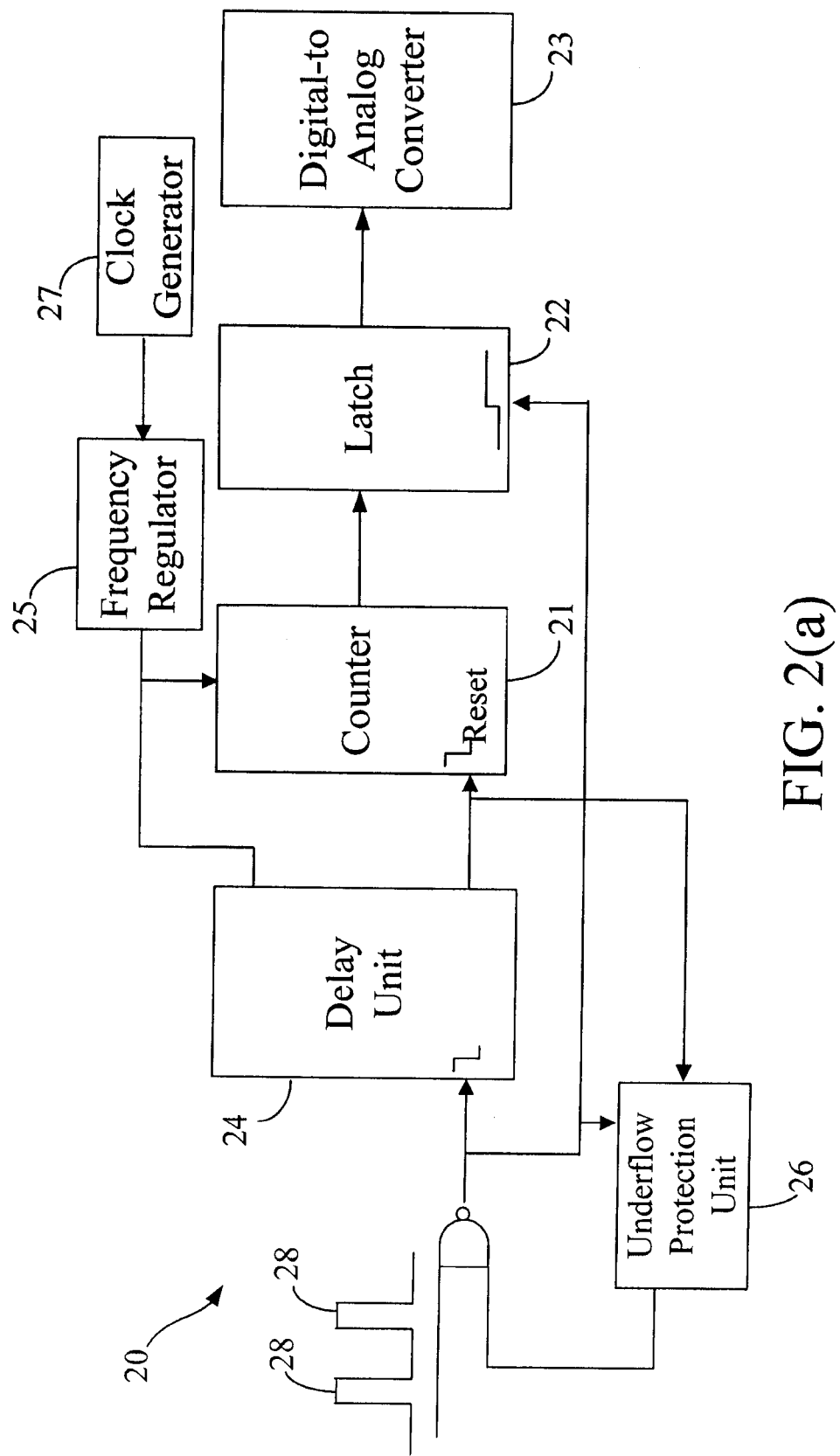
FIG. 2(a) illustrates a circuit block diagram of a PIVC of the present invention.
Figure 2:
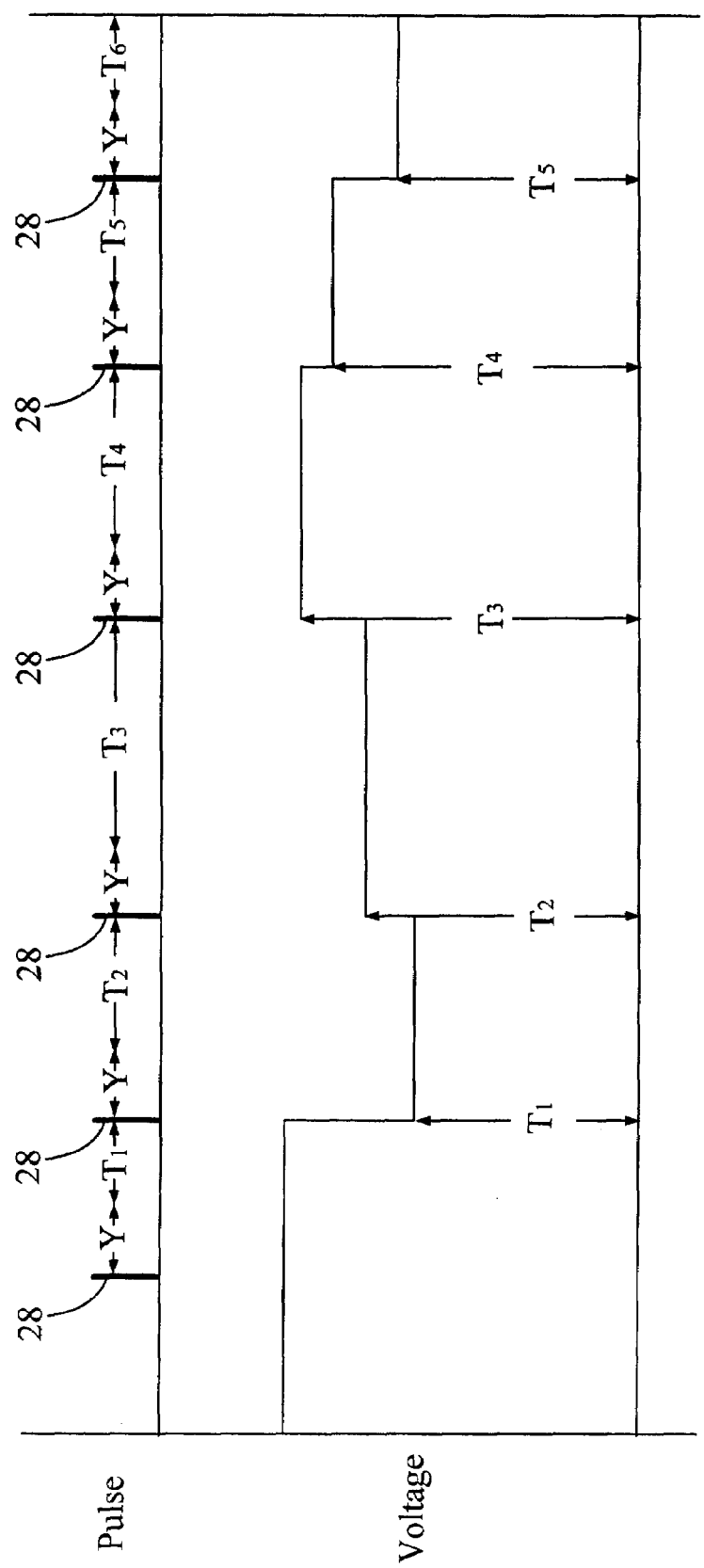
FIG. 2(b) illustrates the conversion of a PIVC of the present invention.
FIGS. 2(c) through 2(e) illustrate the improvements of a PIVC of the present invention.
Figure 2C:
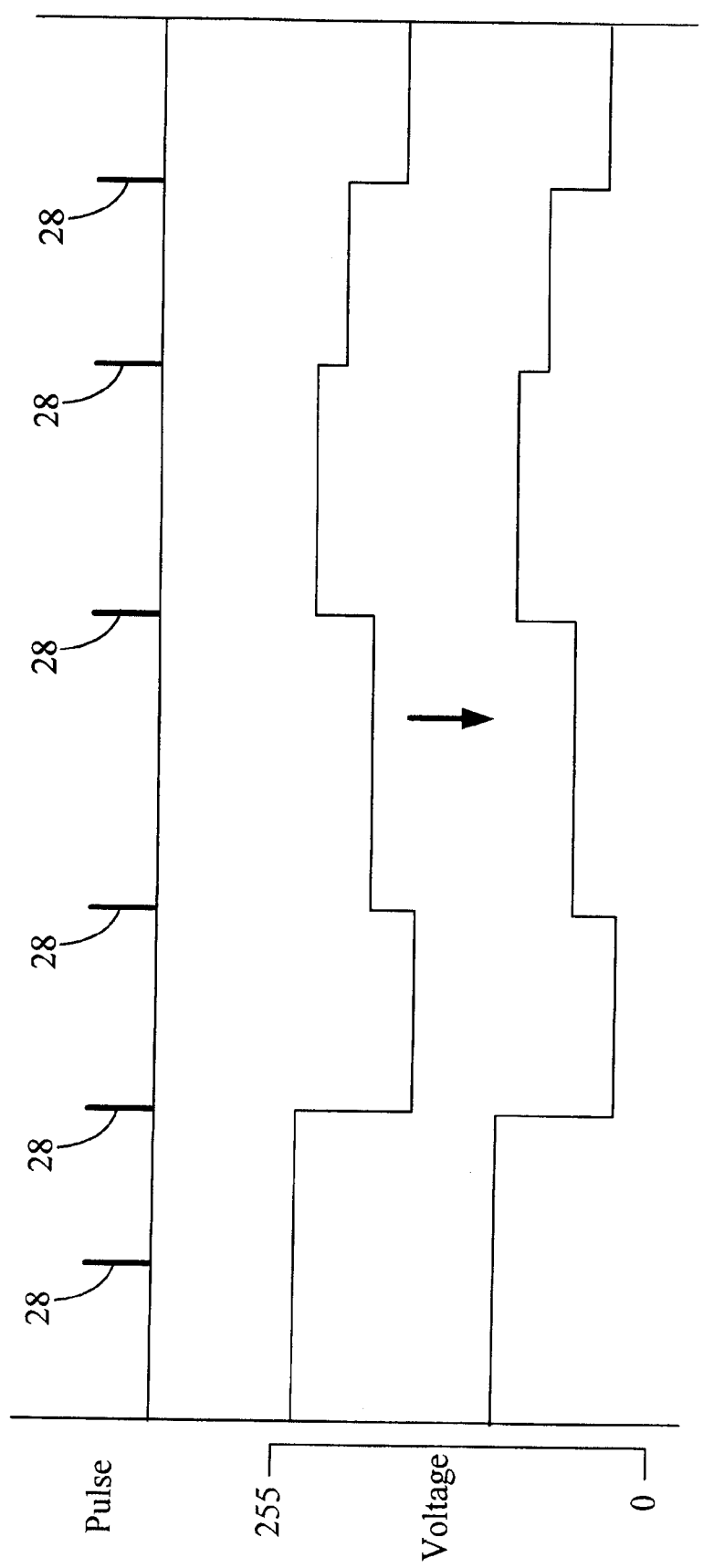
Figure 2D:
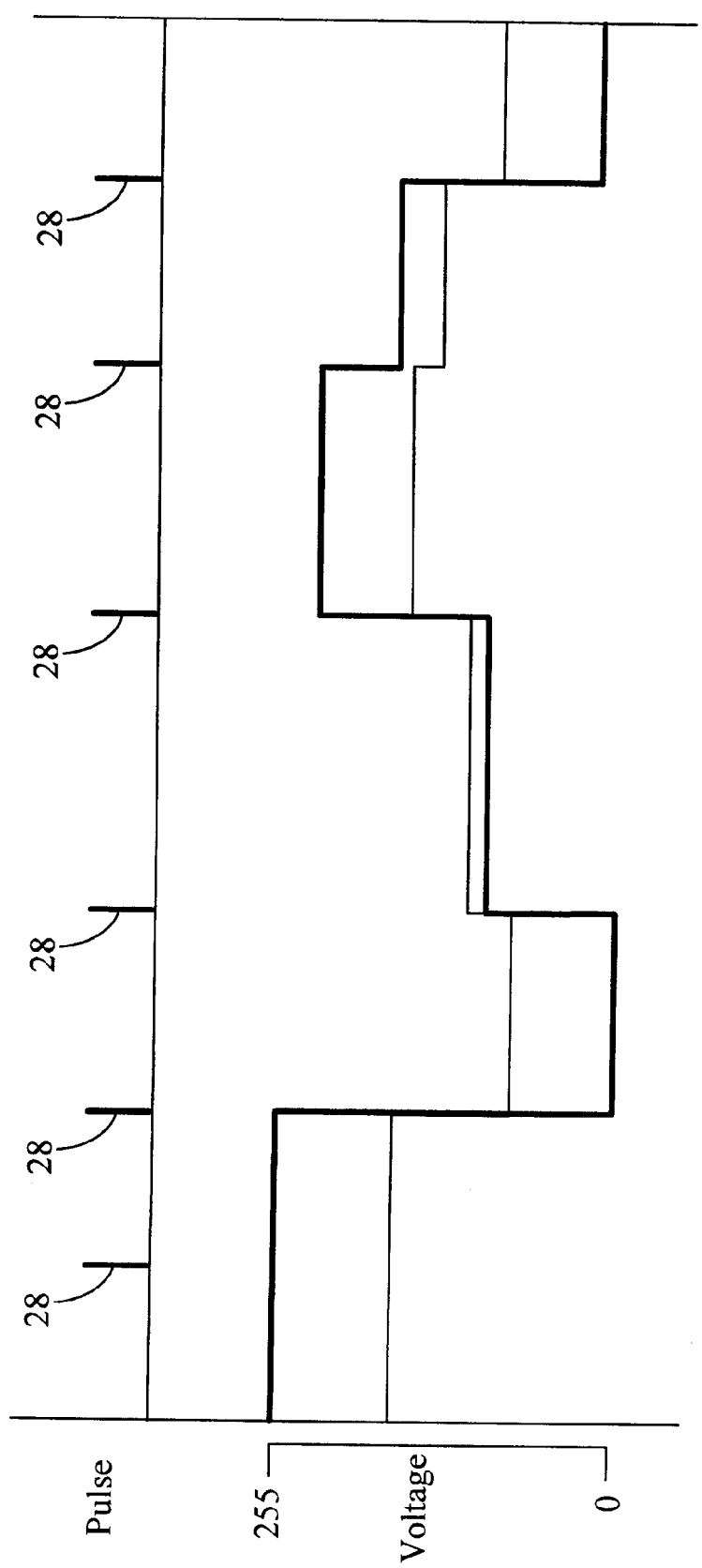
Figure 2E:
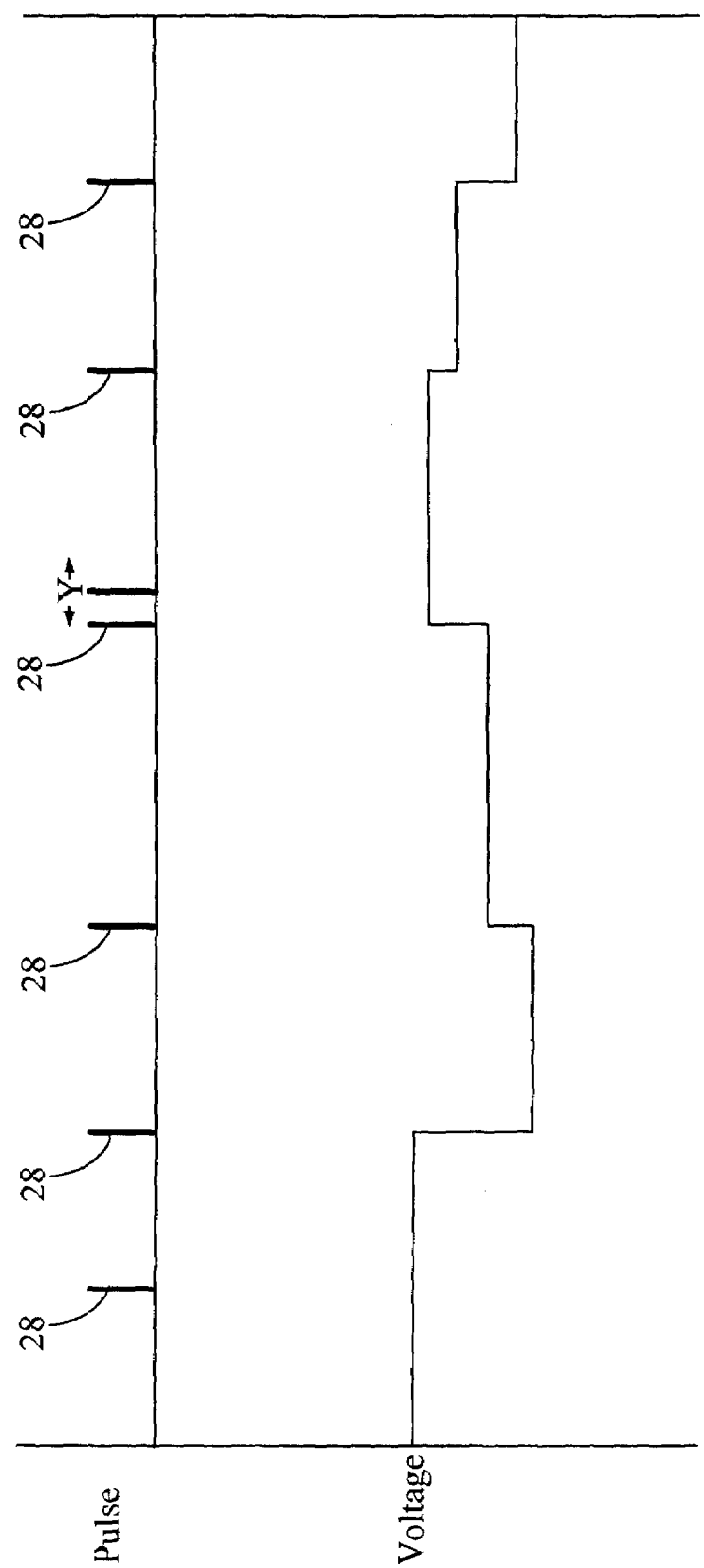

A PIVC 20 shown in FIG. 2(a) is exemplified to highlight the technical characteristics and the advantages of the present invention. The PIVC 20 comprises a counter 21, a latch 22, a digital-to-analog converter 23, a delay unit 24, a frequency regulator 25, an underflow protection unit 26 and a clock generator 27. Pulses 28 are input to the delay unit 24 and eventually converted to analog signals of output voltage by the digital-to-analog converter 23. New components, namely the delay unit 24, the frequency regulator 25 and the underflow protection unit 26, are incorporated into the PIVC 20, compared to the conventional art. The delay unit 24 is intended for the programming of the default duration of delay, so as to delay the time for the counter 21 to reset to zero. If it is set beforehand, that the zero-resetting operation of the counter is to be delayed for Y clock cycles, and that after the delay the pulse intervals between a clock 28 and the next clock 28 are T1 to T6, respectively, the result of the execution is shown in FIG. 2(b). The greater the value of Y is, the lesser T1 to T6 are. Therefore, it is feasible to regulate the baseline of the output voltage while maintaining the relationship between the output voltages of individual pulses, as shown in FIG. 2(c). The frequency regulator 25 regulates the resolution of the output voltage. Assuming the frequency regulator 25 is a frequency multiplier that increases the clock generation frequency of the clock generator 27, and it, coupled with the aforementioned delay unit 24, enhances the resolution of the output voltage, the result is indicated by the bold line in FIG. 2(d). On the contrary, if the resolution is to lower, the frequency regulator 25 will have to be a frequency divider. The underflow protection unit 26 turns back external signals while the delay unit 24 is operating, for example, during a period of Y clock cycles, so as to minimize interference from noise. During the period, even if the counter 21 receives any pulse, it will not reset to zero, as shown in FIG. 2(e).

Figure 3A:
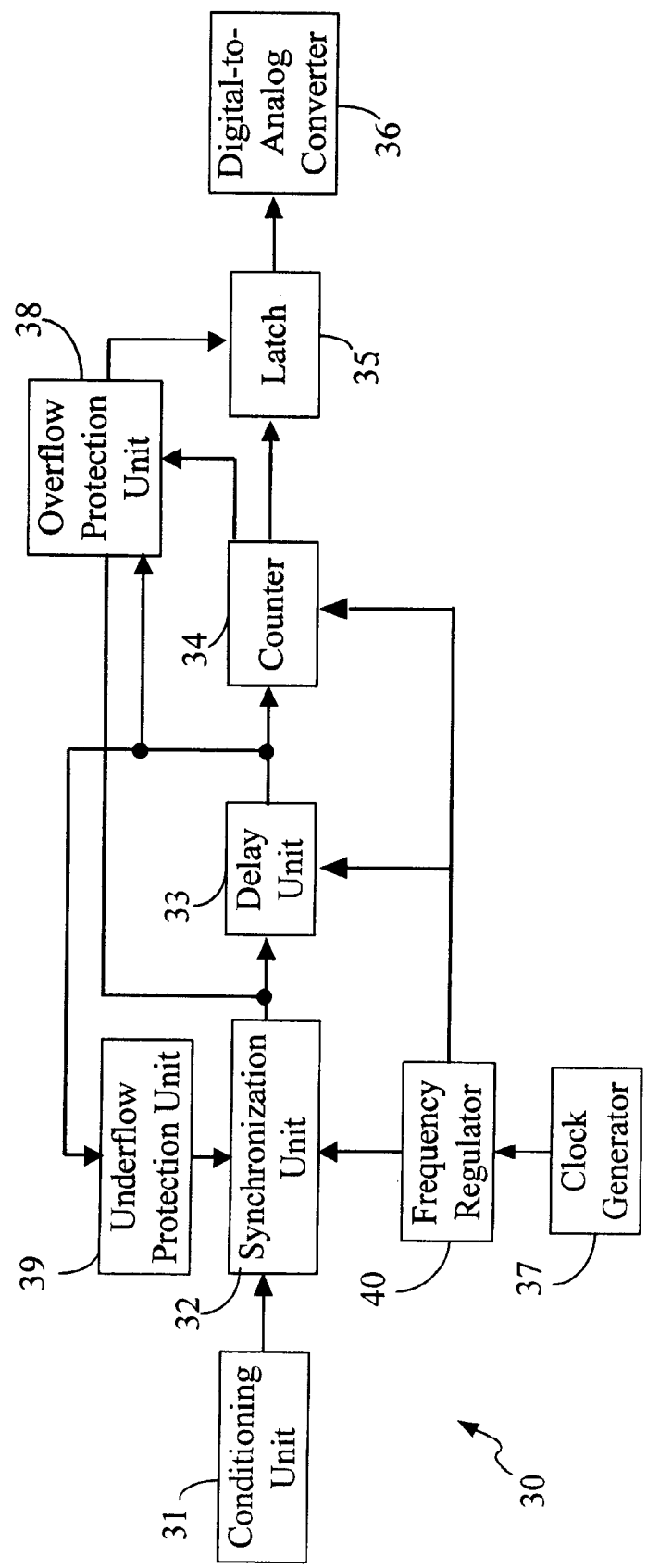
FIG. 3(a) illustrates a circuit block diagram of a PIVC of the present invention.

The detailed circuit of a PIVC in use is exemplified below. FIG. 3(a) is a block diagram of the circuit of a PIVC 30 of the present invention. FIGS. 3(b)–3(g) show the detailed circuit in each block. The PIVC 30 comprises a conditioning unit 31, a synchronization unit 32, a delay unit 33, a counter 34, a latch 35, a digital-to-analog converter 36, a clock generator 37, an overflow protection unit 38, an underflow protection unit 39 and a frequency regulator 40. After receiving a pulse signal, the conditioning unit 31 generates a trigger signal Trig. The trigger signal Trig undergoes phase regulation performed by the synchronization unit 32 to generate a synchronization trigger signal STrig. The delay unit 33 generates a zero-reset signal Zero on the basis of the synchronization trigger signal STrig, to reset the counter 34 to zero.

The function of the conditioning unit 31 is to receive an incoming pulse signal and adjust the incoming pulse signal to turn it into a trigger signal Trig whose voltage lies between the maximum voltage and the minimum voltage, so as to conform to the specification of the transistor-transistor logic (TTL) to be processed later, and the trigger signal Trig is sent to the synchronization unit 32.

Figure 3B:
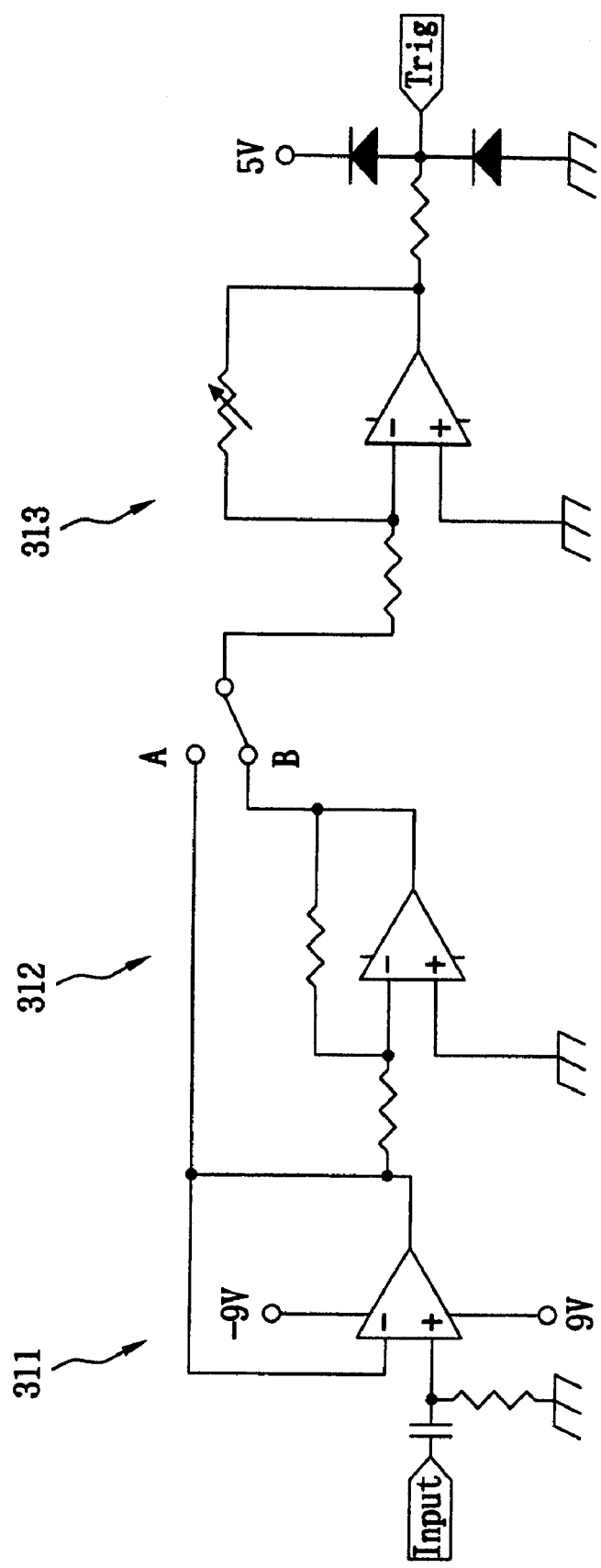
FIGS. 3(b) through 3(g) illustrate the detailed circuits of the circuit blocks shown in FIG. 3(a).

FIG. 3(b) illustrates the detailed circuit of the conditioning unit 31, which is composed of three operational amplifiers (OP), forming a buffer portion 311, a inversion portion 312 and a amplitude adjustment portion 313, wherein the inversion portion 312 may be replaced by a switch (A or B).

The synchronization unit 32 performs phase adjustment to the trigger signal Trig to synchronize the trigger signal Trig with the clock of the clock generator 37, so as to generate the synchronization trigger signal STrig. The width of the synchronization trigger signal STrig is equal to the cycle of the clock, whereas the ascending point and the descending point of the synchronization trigger signal STrig are also synchronized with the clock. In addition to the synchronization unit 32, the clock generator 37 also sends clock signals to the delay unit 33 and the counter 34. Given the design of the synchronization unit 32, the counter 34 and the latch 35 can count the trigger signal Trig more accurately. The bottom of FIG. 3(c) shows the detailed circuit of the synchronization unit 32, which are mainly constituted by two 7474 flip-flops, and combined with auxiliary constituents that include some appropriate logical gates, inverters and passive components.

Figure 3C:
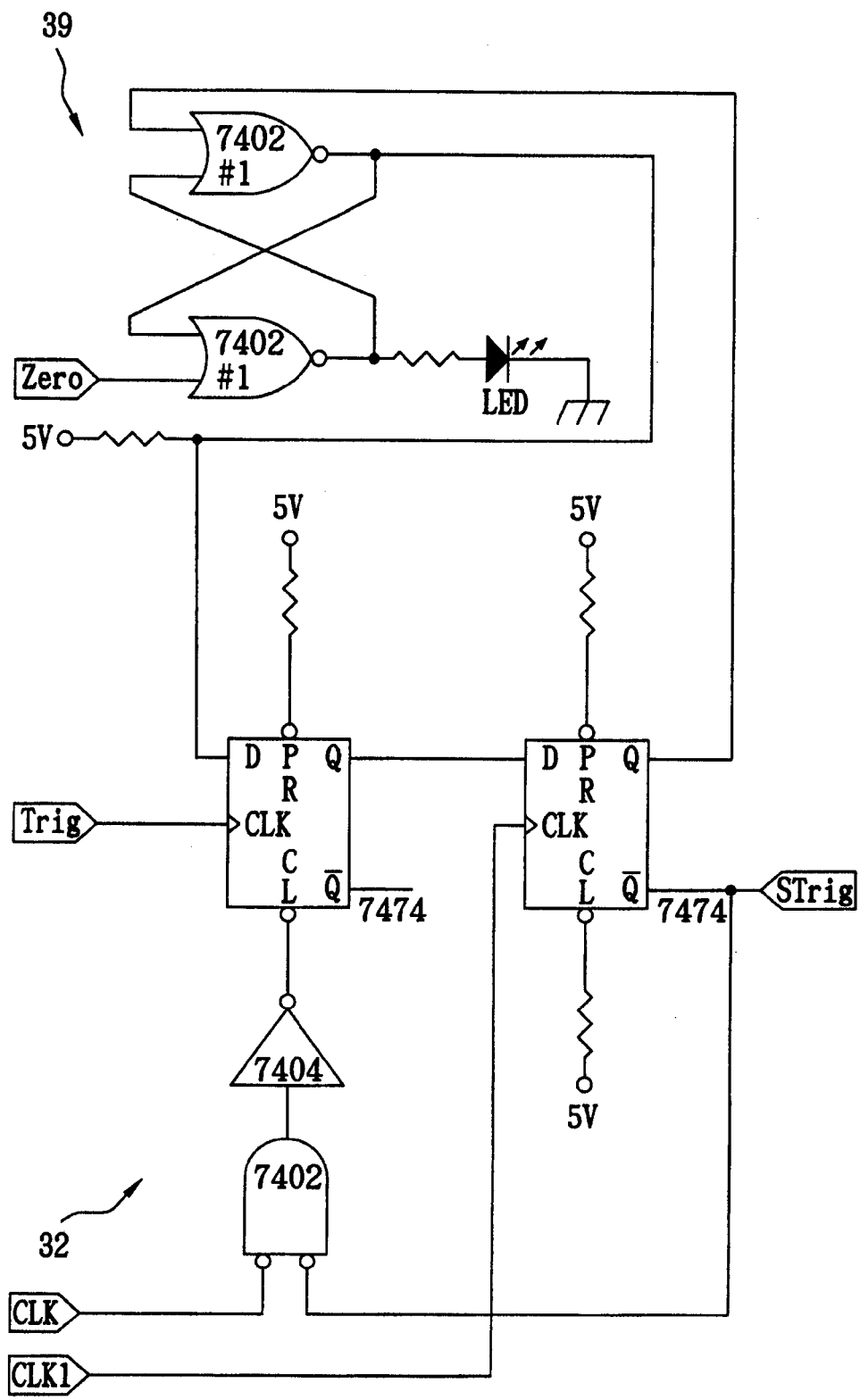

The top of FIG. 3(c) shows the detailed circuit of the underflow protection unit 39 which comprises latches being built on NOR gates, and suitable components. After the trigger signal STrig is generated, but prior to the generation of the signal Zero, that is, within the default duration of delay set by the delay unit 33, the synchronization unit 32 receives no more trigger signal Trig, so as to avoid the interference from short-period noise. Also, a LED may be employed to be turned on after the receipt of a trigger signal Trig to indicate that an incoming signal is received.

Figure 3D:
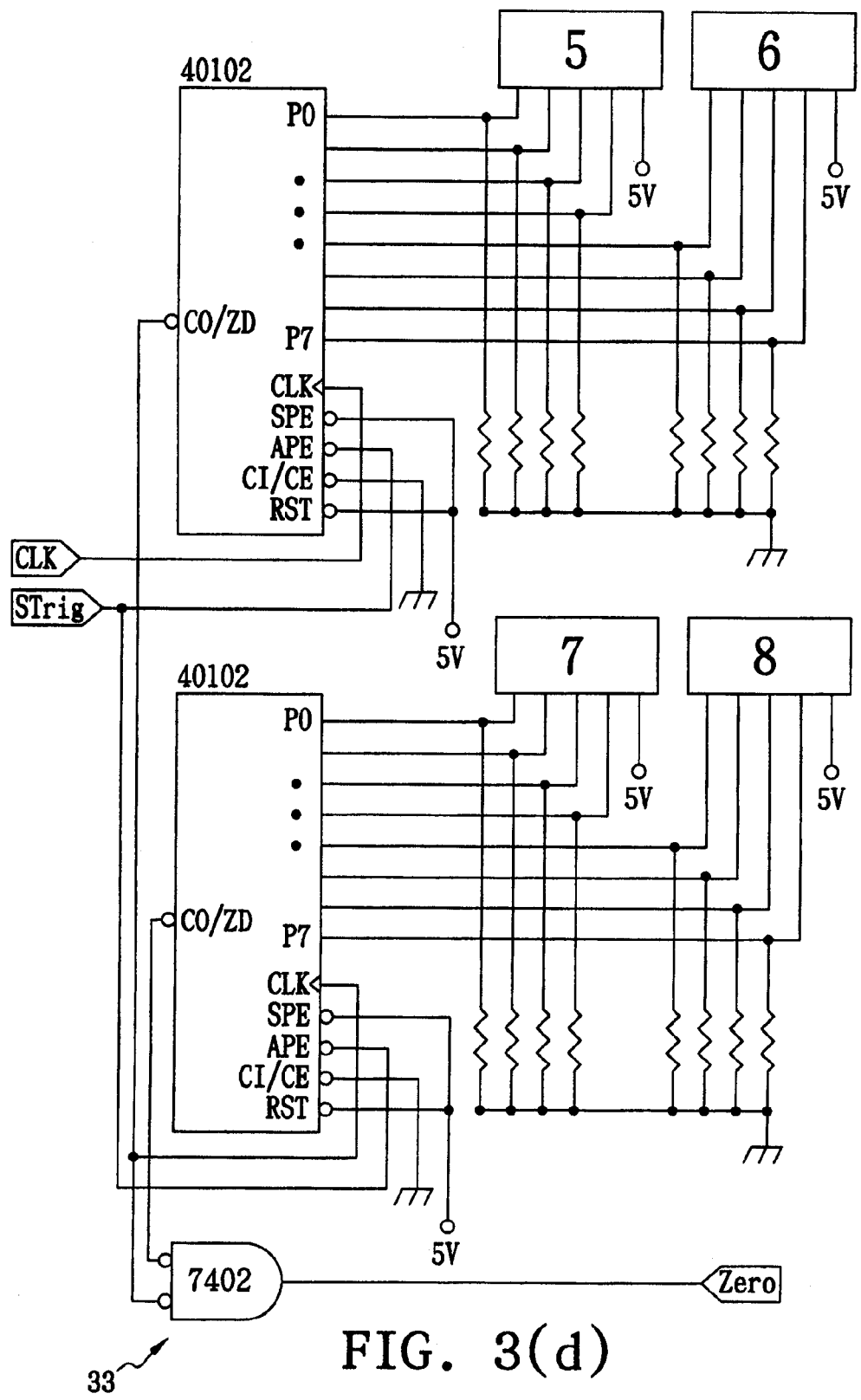

Referring to FIG. 3(d), the delay unit 33 can delay the trigger signal STrig for a specific duration before it sends the signal Zero, with a view to delaying the time for the counter 34 to reset to zero. The number of clock cycles of a delay is precisely set by means of four digital dials 5, 6, 7 and 8. Two 40102 integrated circuit counters, which are categorized in complementary metal oxide semiconductor (CMOS) series, provide 16-bit resolution, and their signals are integrated by a 7402 NOR gate, in order to output a zero-reset signal Zero. The digital input of each of the 40102 integrated circuit counters works along with two digital dials 5 & 6 or 7 & 8 to form an user-machine interface, so as to facilitate the programmable configuration of parameters. Adjustment may be made in the capacity of the 40102 integrated circuit counters, or the binary 40103 may substitute for the decimal 40102, depending on the need.

Figure 3E:
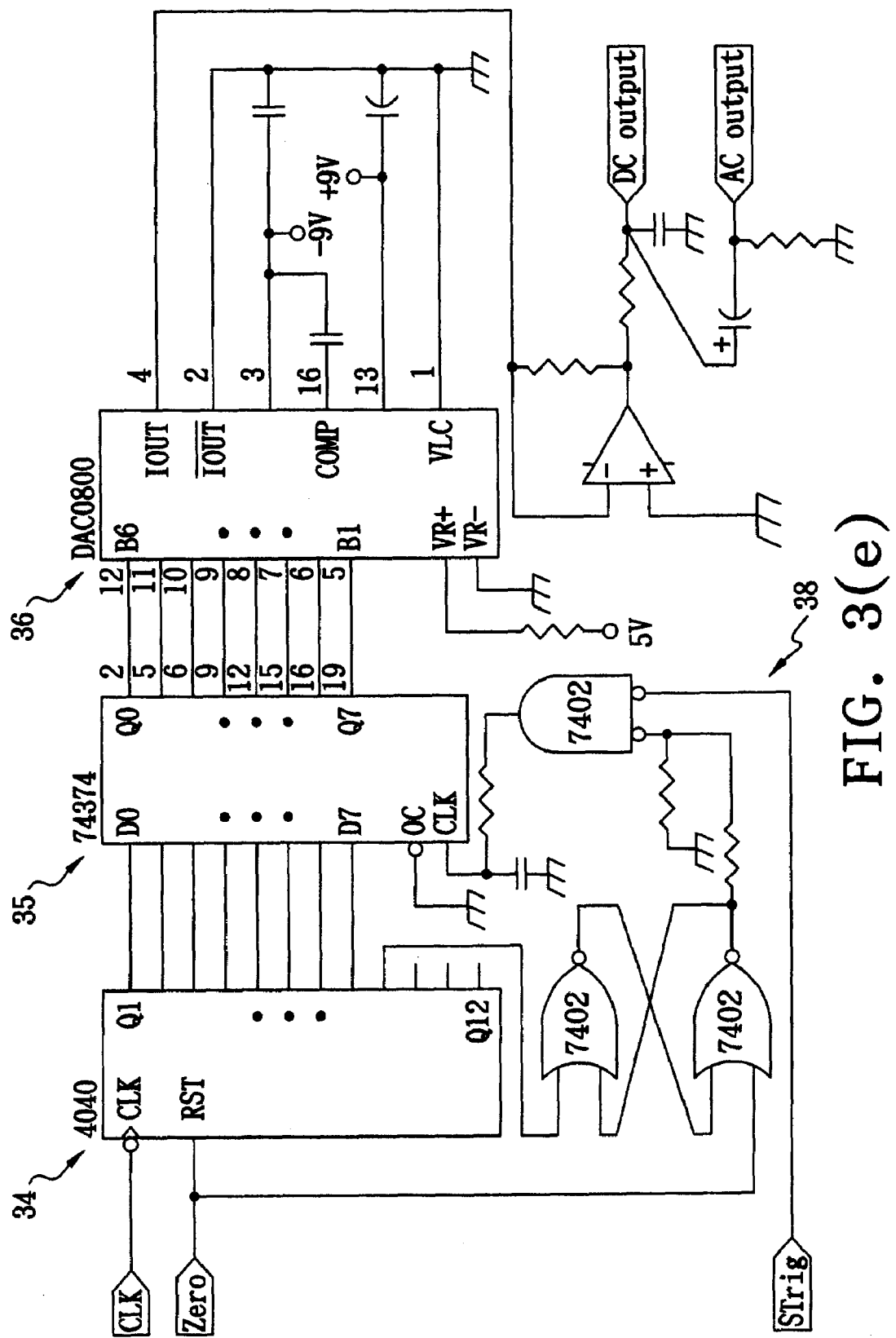

FIG. 3(e) illustrates the detailed circuits of the counter 34, the latch 35 and the digital-to-analog converter 36. The counter 34, essentially comprising a 4040 device, which is periodically reset to zero under the control of the signal Zero, counts the number of clock cycles between two pulses, and it will be displayed at the digital output. The steadily increasing count generated by the counter 34 is frozen at the output of the latch 35 after the next synchronization trigger signal STrig is generated. The count is exactly the number of clock cycles between the occurrence of the preceding zero-reset signal Zero and the occurrence of this synchronization trigger signal STrig. The latch 35 is essentially composed of a 74374 device.

An overflow protection unit 38, installed between the counter 34 and the latch 35, is composed of two 7402 flip-flops, a 7402 NOR gate and passive device. If the duration between the occurrence of the preceding zero-reset signal Zero and the occurrence of this synchronization trigger signal STrig exceeds the default number of bits, an overflow signal will be generated and the data will be ignored.

The digital-to-analog converter 36 can be constituted of a digital-to-analog converter DAC0800, an operational amplifier and appropriate passive devices for generating DC output and AC output simultaneously. The digital-to-analog converter 36 can convert digital signals output from the latch 35 into analog signals that are the final output of the PIVC of the present invention. Analog output is not only easy to observe by the naked eye, but also compatible with the existing analog analytical system and recording system. More importantly, the analog output is easier to perform synchronization analysis with other analog signals.

Figure 3F:
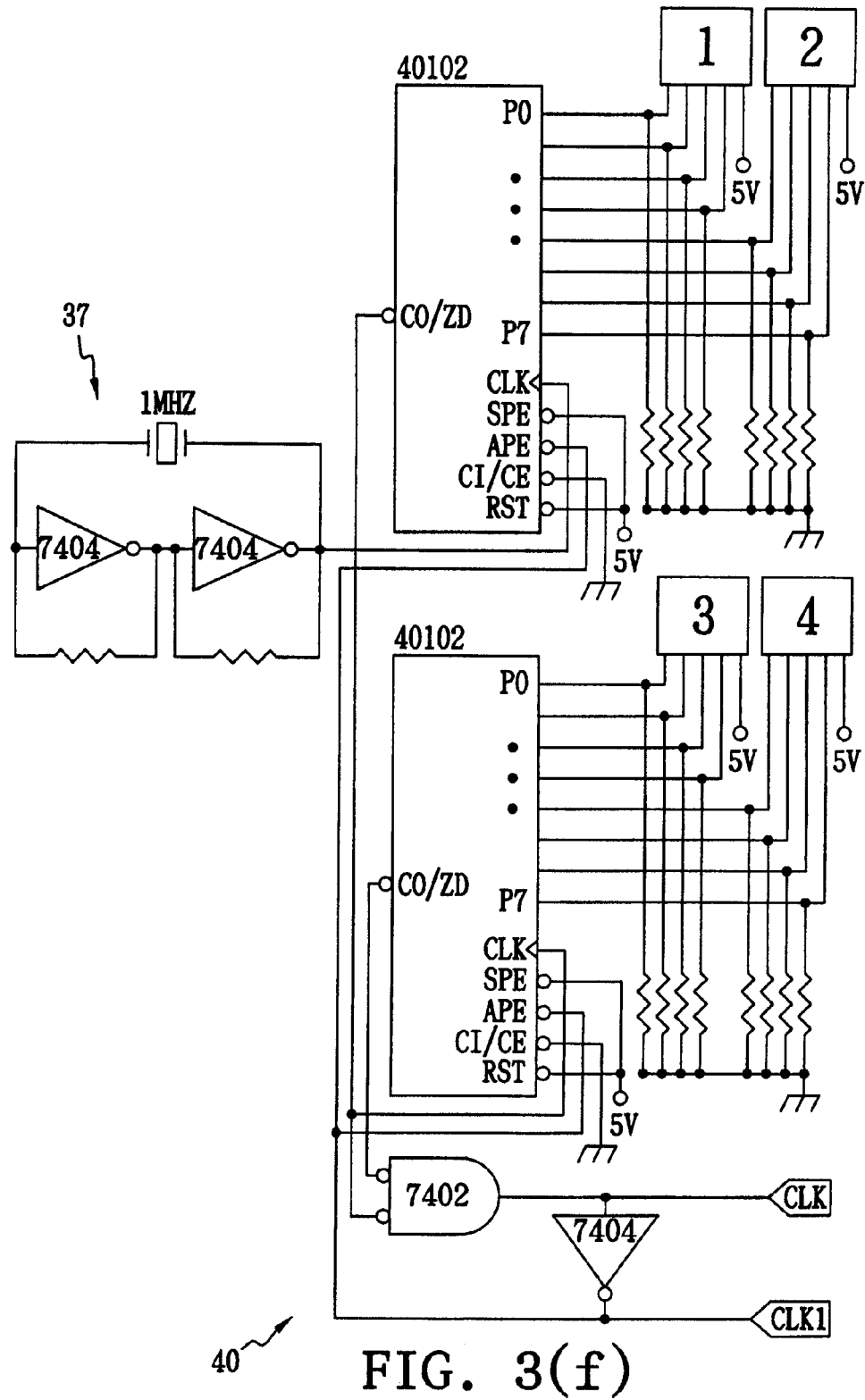

Referring to FIG. 3(f), the clock generator 37 is employed for generating clock signals required for the circuit of the present invention, and its period can be adjusted by users. The clock generator 37 can be constituted by a million Hz quartz crystal and two 7404 inverters. In this embodiment, the frequency regulator 40 is a frequency divider composed essentially of two 40102 integrated circuits, while the signals of the frequency regulator 40 are integrated by a 7402 NOR gate and a 7404 inverter. The frequency divider is designed to lower the frequency of clock generation so as to decrease the resolution of the output voltage. The parameters to be decreased by the frequency divider are input by four digital dials 1, 2, 3 and 4. Adjustment may be made in the quantity of the 40102 integrated circuit, or the binary 40103 may substitute for the decimal 40102, if necessary.

Figure 3G:
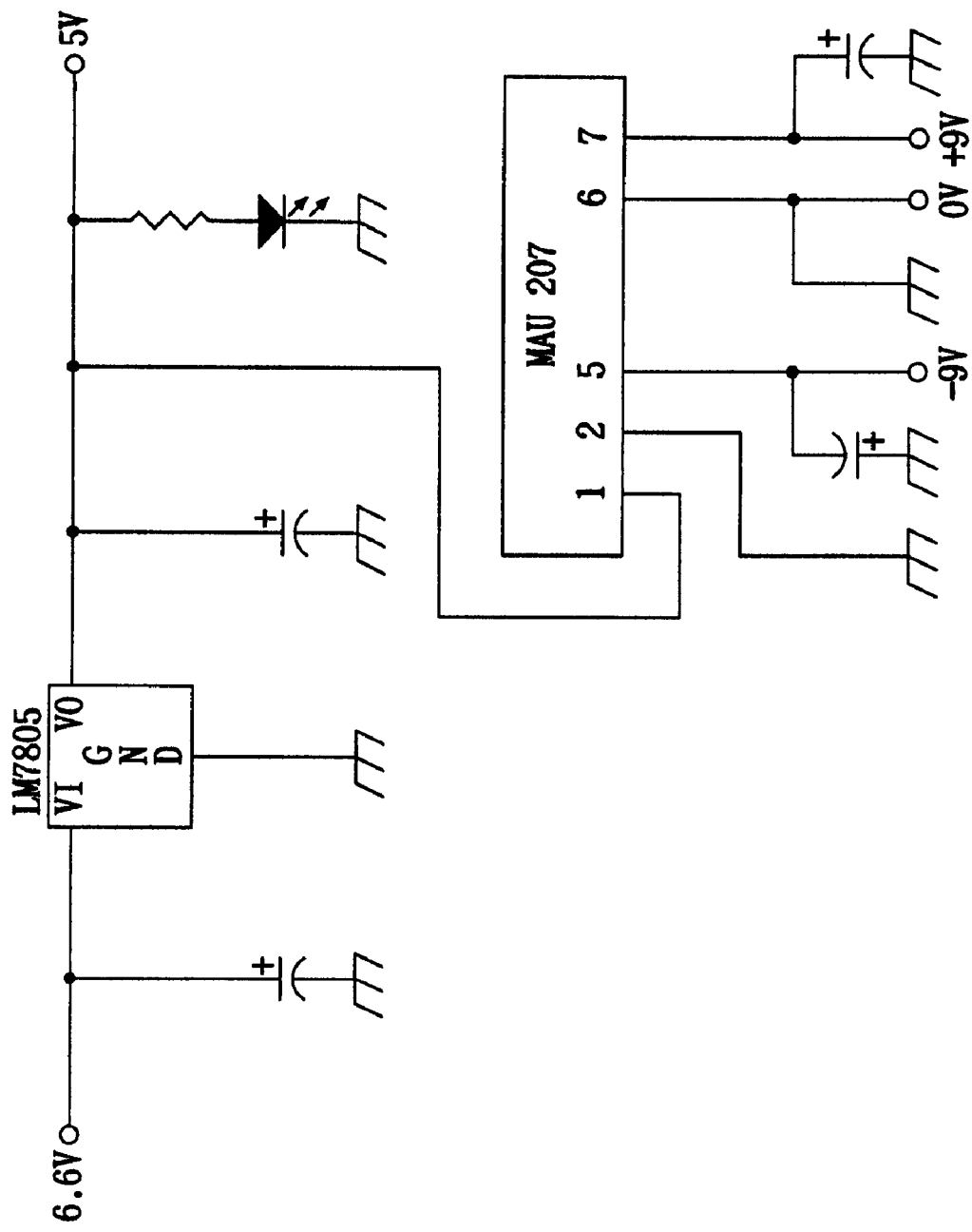

FIG. 3(g) shows the design of the power for the PIVC 30. In this embodiment, the power required for the PIVC 30 is, namely +5V, +9V and −9V. Digital circuit requires +5V, whereas analog circuit requires +9V and −9V. The +5V circuit is constituted by a LM7805 and appropriate passive devices. Aided by appropriate passive devices, a MAU 207 converts power +5V to +9V and −9V.

In practice, the PIVC of the present invention can convert a signal of an electrocardiogram (ECG) to an analog output of the heartbeat period (R-R interval), i.e., the input is a signal of the electrocardiogram, and the output is the heartbeat period, so as to facilitate the analysis of heart rate variability.

The PIVC of the present invention is useful in rebinning and restoring Pulse Wide Modulation (PWM) signals. The circuit of the present invention not only tolerates the noise of some short-period and long-period PWM signals, but also automatically eliminates all abnormal signals of a super-long period and some abnormal signals of a super-short period whenever there are any input PWM signals. Therefore, the affection of abnormal input signals to output stability can be minimized significantly.

The above-described embodiments of the present invention are intended to be illustrative only. Numerous alternative embodiments may be devised by those skilled in the art without departing from the scope of the following claims.

What is claimed is:

1. A pulse interval to voltage converter, comprising:
    a delay unit for delaying an input pulse signal;
    a counter connected to the delay unit, wherein the count of the counter is reset to zero when the counter receives the input pulse signal;
    a latch for locking the count of the counter before the counter is reset;
    a digital-to-analog converter for converting the count of the latch into an analog signal; and
    a synchronization unit for synchronizing the input pulse signal and a clock signal.

2. The pulse interval to voltage converter of claim 1, further comprising a frequency regulator for regulating a clock frequency of a clock generator.

3. The pulse interval to voltage converter of claim 1, further comprising a clock generator for generating clock signals.

4. The pulse interval to voltage converter of claim 2, wherein the frequency regulator is a frequency divider.

5. The pulse interval to voltage converter of claim 1, further comprising an underflow protection circuit for ignoring the count of the counter when the counter exceeds a predetermined value.

6. The pulse interval to voltage converter of claim 1, further comprising an overflow protection circuit for ignoring the count of the counter when the counter exceeds a predetermined value.

7. The pulse interval to voltage converter of claim 1, further comprising a conditioning unit for regulating the input pulse signal to conform to transistor-transistor logic (TTL) specification.

8. The pulse interval to voltage converter of claim 1, wherein the delay unit comprises two counters of integrated circuit (IC) type and a NOR gate.

9. The pulse interval to voltage converter of claim 8, wherein the delay unit further comprises four digital dials, the digital input of each counter of IC type is incorporated with two of the digital dials for setting.

10. The pulse interval to voltage converter of claim 4, wherein the frequency divider comprises two counters of IC type, a NOR gate and an inverter.

11. The pulse interval to voltage converter of claim 10, wherein the frequency divider further comprises four digital dials for setting.

12. A pulse interval to voltage conversion method, comprising:
    (a) delaying an input pulse signal;
    (b) calculating the time between the input pulse signal and its preceding delayed input pulse signal;
    (c) converting the time into a digital voltage; and
    (d) converting the digital voltage into an analog voltage, wherein other input pulse signals are ignored when the input pulse signal is being delayed.

13. The pulse interval to voltage conversion method of claim 12, wherein the time calculation in step (b) is based on the number of clock cycles between the input pulse signal and its preceding delayed input pulse signal.

14. The pulse interval to voltage conversion method of claim 12, further comprising a step of decreasing the frequency of a clock signal.

* * * * *